United States Patent
Xiong et al.

(10) Patent No.: US 11,626,459 B2
(45) Date of Patent: Apr. 11, 2023

(54) DISPLAYING BASE PLATE AND FABRICATING METHOD THEREOF, AND DISPLAYING DEVICE

(71) Applicants: Chengdu BOE Optoelectronics Technology Co., Ltd., Chengdu (CN); BOE Technology Group Co., Ltd., Beijing (CN)

(72) Inventors: Xing Xiong, Beijing (CN); Yun Wang, Beijing (CN); Li Liu, Beijing (CN); Qinglin Wen, Beijing (CN); Chunlei Xu, Beijing (CN); Minghui Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 57 days.

(21) Appl. No.: 17/345,722

(22) Filed: Jun. 11, 2021

(65) Prior Publication Data
US 2022/0165803 A1 May 26, 2022

(30) Foreign Application Priority Data
Nov. 24, 2020 (CN) .......................... 202011333826.1

(51) Int. Cl.
*H01L 27/32* (2006.01)
*H01L 51/00* (2006.01)
*H01L 51/56* (2006.01)

(52) U.S. Cl.
CPC ........ *H01L 27/326* (2013.01); *H01L 51/0018* (2013.01); *H01L 51/56* (2013.01); *H01L 2227/323* (2013.01)

(58) Field of Classification Search
CPC .... H01L 27/326; H01L 51/0017; H01L 51/56
See application file for complete search history.

(56) References Cited

U.S. PATENT DOCUMENTS

| | | | |
|---|---|---|---|
| 10,205,122 B2* | 2/2019 | Choi | H01L 27/3258 |
| 10,615,369 B2* | 4/2020 | Choi | H01L 51/0097 |
| 11,314,279 B2* | 4/2022 | Hong | H01L 27/3234 |
| 11,374,199 B2* | 6/2022 | Wang | H01L 27/3234 |
| 2017/0108173 A1* | 4/2017 | Kim | H01L 33/32 |
| 2017/0237038 A1* | 8/2017 | Kim | H01L 51/5253 257/40 |
| 2017/0288004 A1* | 10/2017 | Kim | H01L 27/326 |

(Continued)

*Primary Examiner* — Douglas M Menz
(74) *Attorney, Agent, or Firm* — IPRO, PLLC

(57) ABSTRACT

A displaying base plate includes an opening region, an adjacent region surrounding the opening region, and a displaying region surrounding the adjacent region, and the displaying base plate located within the adjacent region includes: a substrate base plate; a flat layer and a passivation layer that are provided on one side of the substrate base plate, wherein the passivation layer is provided on one side of the flat layer that is further away from the substrate base plate, a surface of the one side of the flat layer that is further away from the substrate base plate includes at least an inclined plane adjacent to one side of the opening region, and the flat layer includes a first protrusion provided on the inclined plane; and a first isolating groove that at least partially overlaps with the first protrusion and extends throughout the passivation layer and extends into the first protrusion.

17 Claims, 7 Drawing Sheets

(56) References Cited

U.S. PATENT DOCUMENTS

| | | | | |
|---|---|---|---|---|
| 2019/0393279 A1* | 12/2019 | Lee | ............... | H01L 51/56 |
| 2020/0295102 A1* | 9/2020 | Qin | ............... | H01L 51/5253 |
| 2021/0242434 A1* | 8/2021 | Zhang | ............... | G03F 1/38 |
| 2021/0367197 A1* | 11/2021 | Sun | ............... | H01L 51/5253 |
| 2022/0181407 A1* | 6/2022 | Jing | ............... | H01L 27/326 |

* cited by examiner

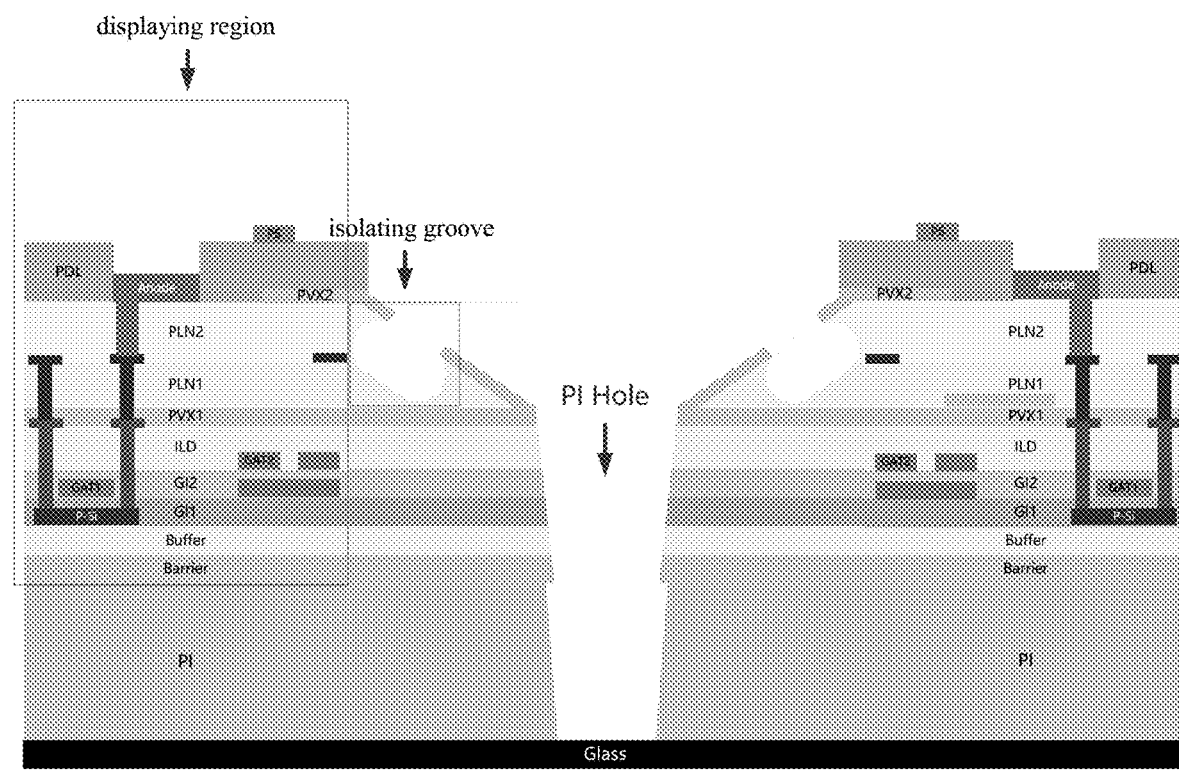
Fig. 1 --Prior Art--
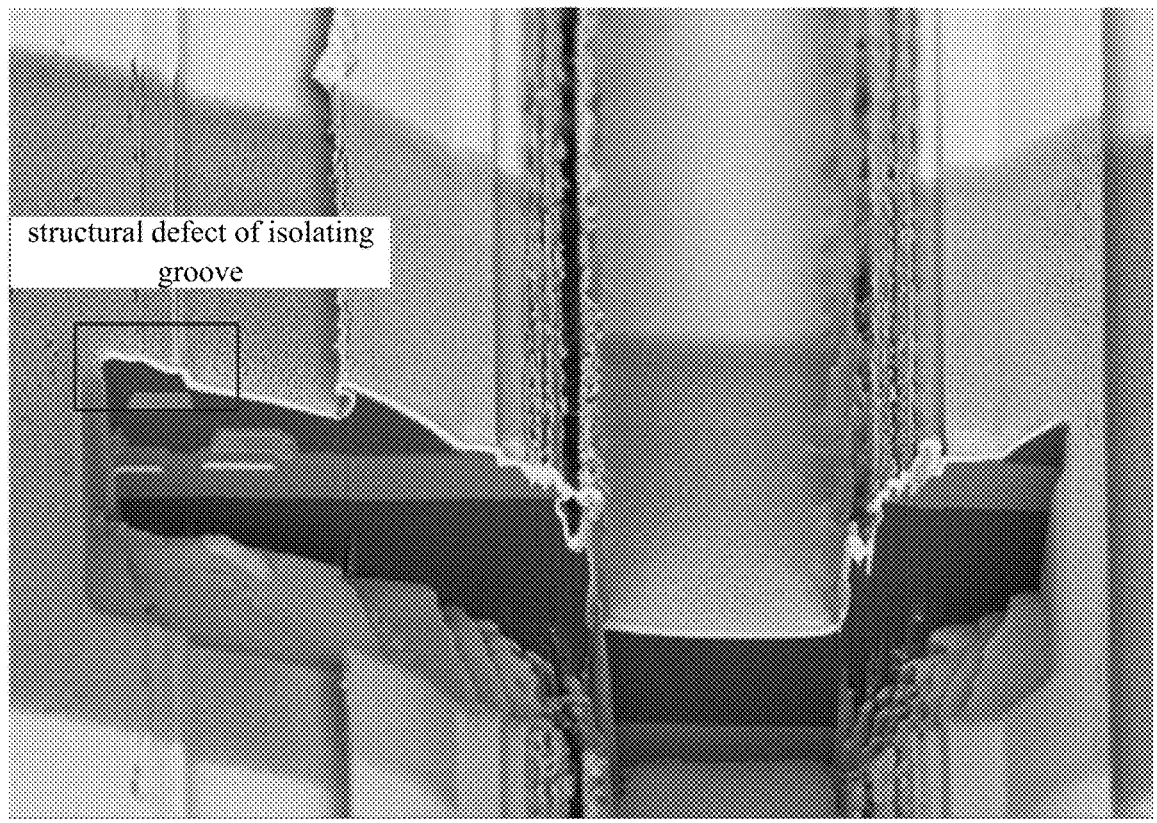
Fig. 2 --Prior Art--

DISPLAYING BASE PLATE AND FABRICATING METHOD THEREOF, AND DISPLAYING DEVICE

CROSS REFERENCE TO RELEVANT APPLICATIONS

The present disclosure claims the priority of the Chinese patent application filed on Nov. 24, 2020 before the Chinese Patent Office with the application number of 202011333826.1 and the title of "DISPLAYING BASE PLATE AND FABRICATING METHOD THEREOF, AND DISPLAYING DEVICE", which is incorporated herein in its entirety by reference.

TECHNICAL FIELD

The present disclosure relates to the technical field of displaying, and particularly relates to a displaying base plate and a fabricating method thereof, and a displaying device.

BACKGROUND

With the development of the technique of displaying, Organic Light Emitting Diodes (for short, OLED), which can perform flexible displaying, facilitate the diversity of displaying, and have gradually become the mainstream of the technique of displaying. In order to develop the function of stretchable OLED displaying, usually, the substrate material of an OLED flexible displaying device is tapped, and an adjacent region surrounding the opening region and a displaying region surrounding the adjacent region are formed, thereby realizing the stretching of the displaying device by the deformation of the adjacent region.

SUMMARY

The present disclosure provides a displaying base plate and a fabricating method thereof, and a displaying device.

The present disclosure discloses a displaying base plate, wherein the displaying base plate comprises an opening region, an adjacent region surrounding the opening region, and a displaying region surrounding the adjacent region, and the displaying base plate located within the adjacent region comprises:

a substrate base plate;

a flat layer and a passivation layer, wherein the flat layer is provided on one side of the substrate base plate, the passivation layer is provided on one side of the flat layer that is further away from the substrate base plate, a surface of the one side of the flat layer that is further away from the substrate base plate comprises at least an inclined plane adjacent to one side of the opening region, and the flat layer comprises a first protrusion provided on the inclined plane; and a first isolating groove, wherein the first isolating groove and the first protrusion at least partially overlap, and the first isolating groove extends throughout the passivation layer and extends into the first protrusion.

In an optional implementation, in a direction perpendicular to the inclined plane, an orthographic projection of a first cross-section of the first protrusion on the inclined plane is located within an area of an orthographic projection of a second cross-section on the inclined plane, wherein the first cross-section is located on one side of the second cross-section that is further away from the inclined plane.

In an optional implementation, an included angle between a side face of the first protrusion and the inclined plane is greater than or equal to 30°, and less than or equal to 55°.

In an optional implementation, the first protrusion surrounds the opening region, and in a direction of surrounding of the opening region by the first protrusion, a size of an orthographic projection of a cross-section of the first protrusion on the inclined plane is greater than or equal to 3 µm, and less than or equal to 8 µm.

In an optional implementation, in the direction of surrounding of the opening region by the first protrusion, a ratio of the size of the orthographic projection of the cross-section of the first protrusion on the inclined plane to a size of the inclined plane is greater than or equal to 30%, and less than or equal to 80%.

In an optional implementation, within the first isolating groove, the flat layer is retracted relative to the passivation layer.

In an optional implementation, a surface of the one side of the flat layer that is further away from the substrate base plate further comprises a horizontal plane located on one side of the inclined plane that is closer to the displaying region, and the displaying base plate located within the adjacent region further comprises: a second isolating groove; and the second isolating groove extends throughout the passivation layer and extends into the flat layer, and an orthographic projection of the second isolating groove on the flat layer is located within an area of the horizontal plane.

In an optional implementation, within the second isolating groove, the flat layer is retracted relative to the passivation layer.

In an optional implementation, a surface of the one side of the flat layer that is further away from the substrate base plate further comprises a horizontal plane located on one side of the inclined plane that is closer to the displaying region, and the flat layer further comprises a second protrusion provided on the horizontal plane; and in a direction perpendicular to the horizontal plane, an orthographic projection of a third cross-section of the second protrusion on the horizontal plane is located within an area of an orthographic projection of a fourth cross-section on the horizontal plane, wherein the third cross-section is located on one side of the fourth cross-section that is further away from the horizontal plane.

In an optional implementation, the displaying base plate further comprises:

a third isolating groove, wherein the third isolating groove and the second protrusion at least partially overlap, and the third isolating groove extends throughout the passivation layer and extends into the second protrusion.

In an optional implementation, an included angle between a side face of the second protrusion and the horizontal plane is greater than or equal to 30°, and less than or equal to 55°.

In an optional implementation, within the third isolating groove, the flat layer is retracted relative to the passivation layer.

The present disclosure further discloses a displaying device, wherein the displaying device comprises the displaying base plate according to any one of the above embodiments.

The present disclosure further discloses a fabricating method of a displaying base plate, wherein the displaying base plate comprises an opening region, an adjacent region surrounding the opening region, and a displaying region surrounding the adjacent region, and the fabricating method of a displaying base plate located within the adjacent region comprises:

providing a substrate base plate;

forming sequentially a flat layer and a passivation layer on one side of the substrate base plate, wherein a surface of one side of the flat layer that is further away from the substrate base plate comprises at least an inclined plane adjacent to one side of the opening region, and the flat layer comprises a first protrusion provided on the inclined plane; and performing dry etching sequentially to the passivation layer and the first protrusion, to form a first isolating groove, wherein the first isolating groove and the first protrusion at least partially overlap, and the first isolating groove extends throughout the passivation layer and extends into the first protrusion.

In an optional implementation, the step of forming sequentially the flat layer and the passivation layer on the one side of the substrate base plate comprises:

by using a film-formation process, forming a flat material layer on one side of the substrate base plate;

performing exposure and development to the flat material layer, to form the flat layer, wherein the first protrusion is formed by patterning the flat layer; and by using a patterning process, forming the passivation layer on the one side of the flat layer that is further away from the substrate base plate.

In an optional implementation, the step of performing dry etching sequentially to the passivation layer and the first protrusion, to form the first isolating groove comprises:

by using a mask plate, performing dry etching to the passivation layer; and by using the passivation layer obtained after the dry etching as a mask plate of the flat layer, performing dry etching to the first protrusion, to obtain the first isolating groove.

In an optional implementation, a transverse etching amount of the first protrusion is greater than a transverse etching amount of the passivation layer.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure, the figures that are required to describe the embodiments of the present disclosure will be briefly introduced below. Apparently, the figures that are described below are embodiments of the present disclosure, and a person skilled in the art can obtain other figures according to these figures without paying creative work.

FIG. 1 shows a schematic sectional structural diagram of a displaying base plate in the related art;

FIG. 2 shows a structural diagram of an isolating groove in a displaying base plate in the related art;

DETAILED DESCRIPTION

In order to make the above purposes, features and advantages of the present disclosure more apparent and understandable, the present disclosure will be described in further detail below with reference to the drawings and the particular embodiments. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

In the related art, in order to prevent water and oxygen from entering the functional film layers from the holes, usually an isolating groove is provided on the flat layer, and, in order to save the room, usually the isolating groove is provided on an edge slope of the flat layer that is closer to the opening region, as shown in FIG. 1. The inventor has found that the formation of the isolating groove requires to perform dry etching sequentially to the passivation layer and the flat layer, and, in the dry etching of the passivation layer, because of the film-layer offset on the slope is too large, the photoresist on the slope flows toward the opening region, and the passivation layer closer to the displaying region is etched off without the protection by the photoresist, which results in that the flat layer at the region is exposed, and, therefore, the isolating groove closer to the displaying region has a structural defect, as shown in FIG. 2, thereby affecting the packaging effect.

Figure 3:
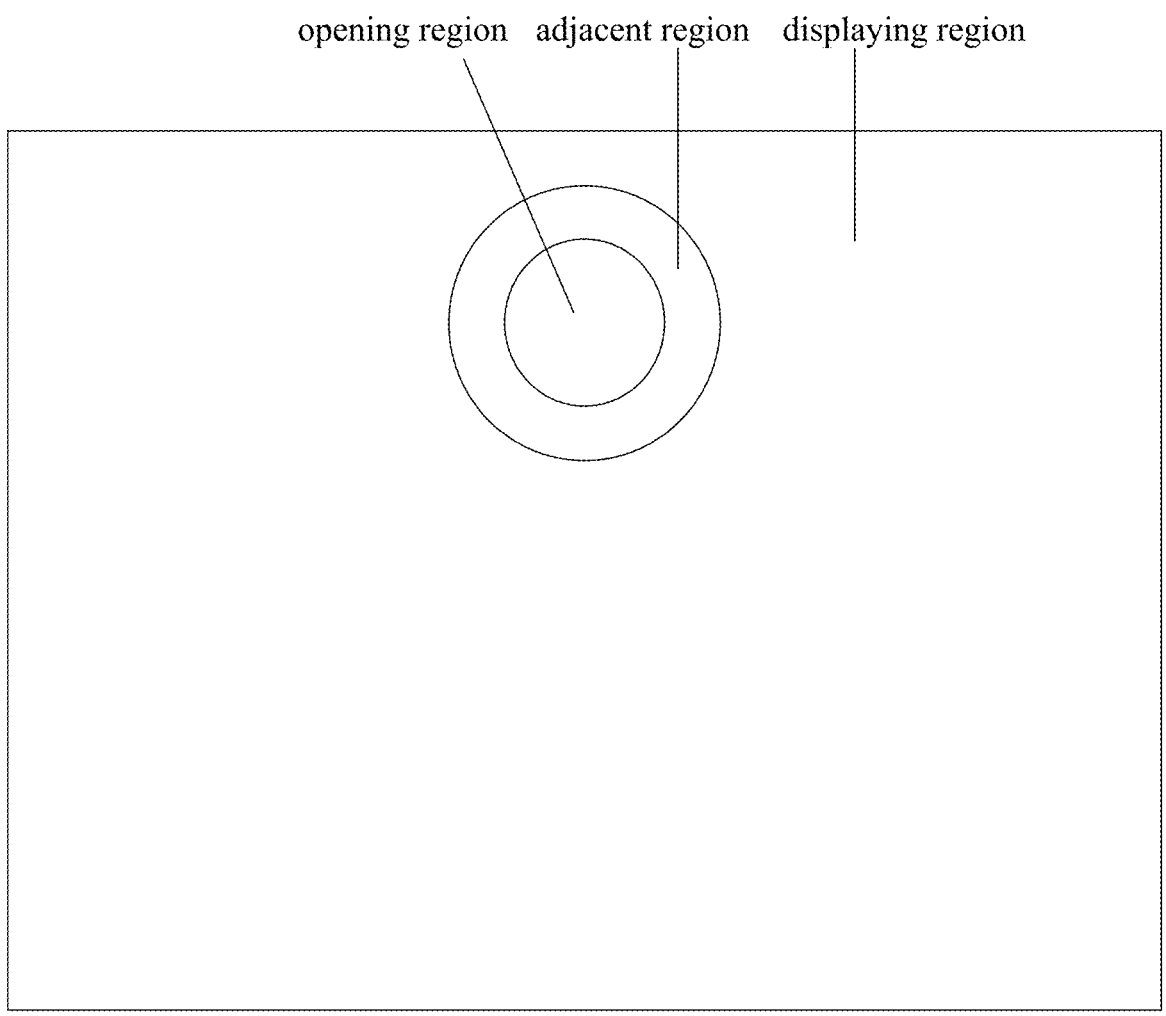
FIG. 3 shows a schematic planar structural diagram of the displaying base plate according to an embodiment of the present disclosure.
Figure 4:
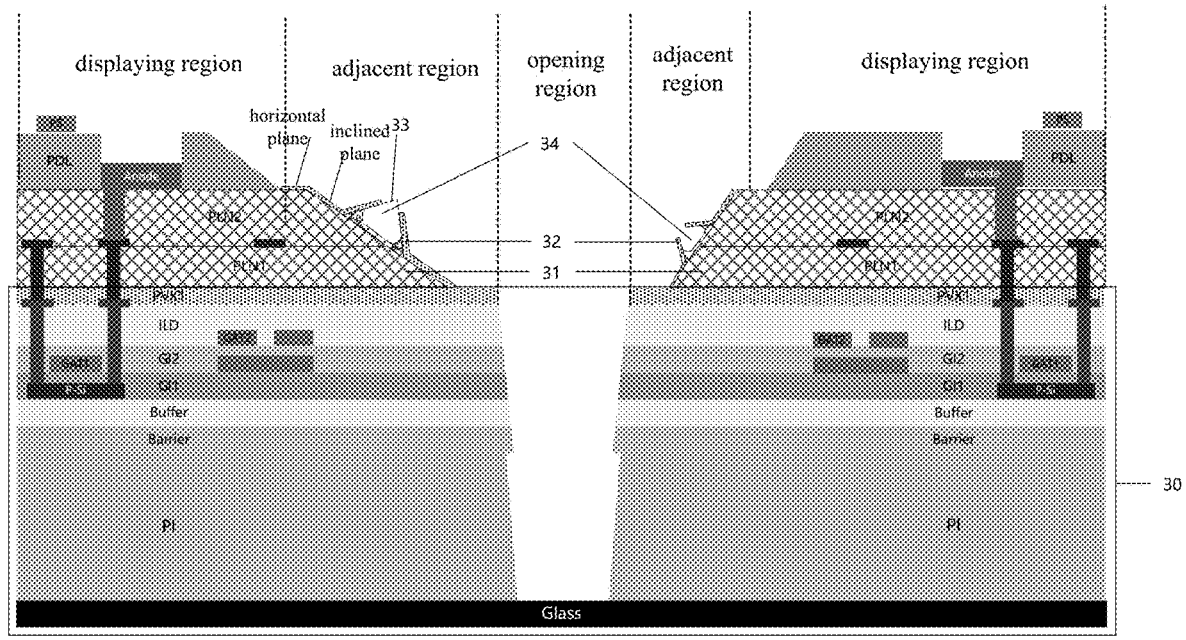
FIG. 4 shows a schematic sectional structural diagram of the first displaying base plate according to an embodiment of the present disclosure.
Figure 5:
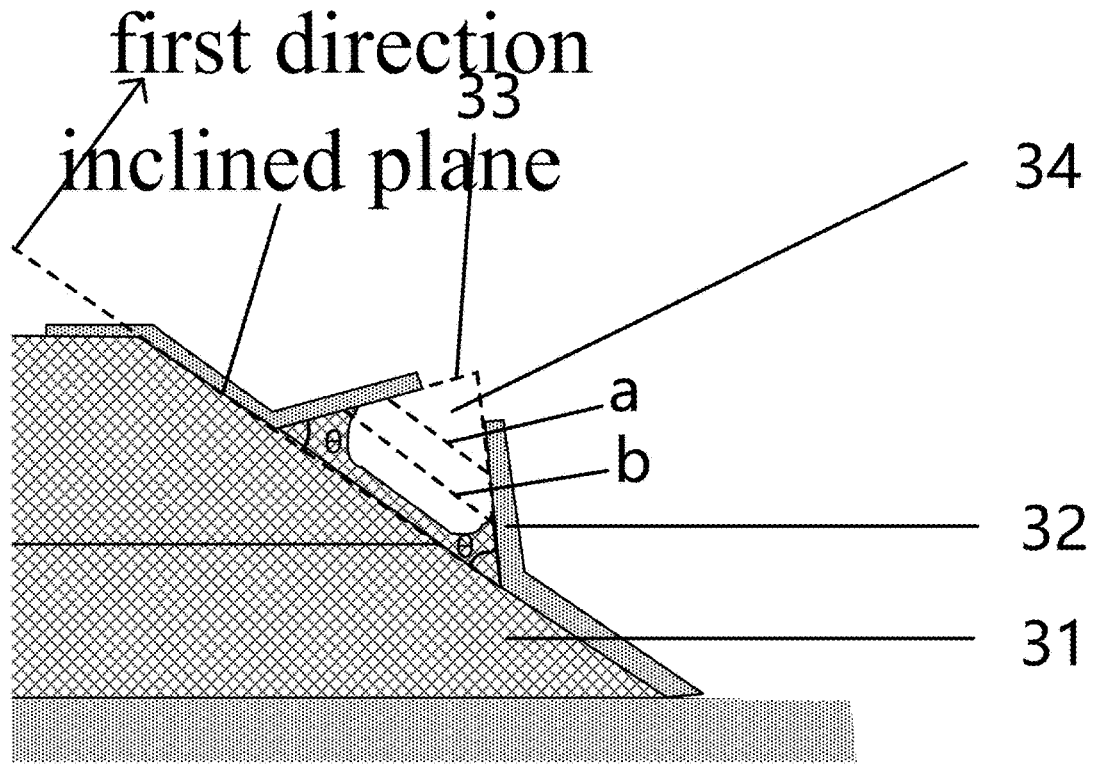
FIG. 5 shows a schematic sectional structural diagram of the adjacent region of the first displaying base plate according to an embodiment of the present disclosure.

In order to solve the above problems, an embodiment of the present disclosure provides a displaying base plate. Referring to FIG. 3, FIG. 3 shows a schematic planar structural diagram of the displaying base plate according to the present embodiment. The displaying base plate comprises an opening region, an adjacent region surrounding the opening region, and a displaying region surrounding the adjacent region. Referring to FIG. 4, FIG. 4 shows a schematic sectional structural diagram of the displaying base plate according to the present embodiment. Referring to FIG. 5, FIG. 5 shows a schematic sectional structural diagram of the adjacent region of the displaying base plate according to the present embodiment. The displaying base plate located within the adjacent region comprises: a substrate base plate 30; a flat layer 31 and a passivation layer 32 that are provided on one side of the substrate base plate 30, wherein the passivation layer 32 is provided on one side of the flat layer 31 that is further away from the substrate base plate 30, the surface of the one side of the flat layer 31 that is further away from the substrate base plate 30 comprises at least an inclined plane adjacent to one side of the opening region, and the flat layer 31 comprises a first protrusion 33 provided on the inclined plane; and a first isolating groove 34, wherein the first isolating groove 34 at least partially overlaps with the first protrusion 33, and extends throughout the passivation layer 32 and extends into the first protrusion 33.

The technical solutions of the present disclosure, by providing on the inclined plane of the flat layer 31 the first protrusion 33, which can block the photoresist from flowing toward the opening region, prevent the defect of the passivation layer 32 caused by the loss of the photoresist, thereby forming an isolating groove of a complete structure. In addition, the isolating groove of a complete structure can increase the adhesivity of the packaging film layer in the isolating groove, which ensures the packaging performance, thereby improving the reliability and the displaying performance of the displaying device. Furthermore, for the same side-etching depth, as compared with the related art, by forming the first isolating groove 34, the etched volume of the flat layer 31 can be reduced by 20%-40%. Therefore, the structure of the first isolating groove can shorten the etching duration, improve the production efficiency, and reduce the production cost.

Referring to FIG. 5, within the first isolating groove 34, the flat layer 31 may be retracted relative to the passivation layer 32. In practical applications, the first isolating groove 34 is formed by sequentially dry-etching the passivation layer 32 and the flat layer 31, wherein the transverse etching amount of the flat layer 31 is greater than the transverse etching amount of the passivation layer 32, which makes the groove mouth of the first isolating groove 34 relatively narrow. That can result in the appearance of "undercut+ upward opening" of the first isolating groove 34, which further improves the adhesion effect of the packaging film layer in the first isolating groove 34, and ensures the packaging performance.

In a particular implementation, referring to FIG. 5, in the direction perpendicular to the inclined plane (the first direction in FIG. 5), the orthographic projection of a first cross-section a of the first protrusion 33 on the inclined plane may be located within the area of the orthographic projection of a second cross-section b on the inclined plane, wherein the first cross-section a is located on one side of the second cross-section b that is further away from the inclined plane.

The first cross-section a and the second cross-section b are cross-sections of the first protrusion 33 in the normal direction of the inclined plane (the first direction in FIG. 5), and both of the first cross-section a and the second cross-section b are parallel to the inclined plane. Such a structure of the first protrusion 33 can further ensure the intactness of the passivation layer 32 provided on one side of the first protrusion 33 that is further away from the substrate base plate 30, and prevent the defect of the passivation layer 32 caused by the loss of the photoresist.

It should be noted that, for reasons such as process deviations, the angle between the first direction and the inclined plane might not be strictly 90°. Therefore, the angle between the first direction and the inclined plane is not limited to 90°, and the actual angle therebetween is decided by the capacity of process controlling.

In practical applications, the first isolating groove 34 is of a closed structure that surrounds the opening region and has connected head and tail. The first protrusion 33 may surround the opening region, and in the direction of the surrounding of the opening region by the first protrusion 33, the cross-section of the first protrusion 33 (i.e., the section shown in FIG. 4) may, for example, be a triangle, a trapezoid whose longer side is closer to the inclined plane, an arc whose opening faces the inclined plane, and so on.

Referring to FIG. 4, in the direction of the surrounding of the opening region by the first protrusion 33, the size of the orthographic projection of the cross-section of the first protrusion 33 on the inclined plane may be greater than or equal to 3 μm and less than or equal to 8 μm. When the cross-section of the first protrusion 33 is a triangle, the bottom side of the triangle may be greater than or equal to 3 μm and less than or equal to 8 μm. In practical applications, in the direction of the surrounding of the opening region by the first protrusion 33, the ratio of the size of the orthographic projection of the cross-section of the first protrusion 33 on the inclined plane to the size of the inclined plane may be 30%-80%. Accordingly, the intactness of the passivation layer 32 provided on the one side of the first protrusion 33 that is further away from the substrate base plate 30 can be further ensured, to prevent the defect of the passivation layer 32 caused by the loss of the photoresist.

The included angle θ between the side face of the first protrusion 33 and the inclined plane may be greater than or equal to 30° and less than or equal to 55°. Accordingly, the intactness of the passivation layer 32 provided on the one side of the first protrusion 33 that is further away from the substrate base plate 30 can be further ensured, to prevent the defect of the passivation layer 32 caused by the loss of the photoresist.

Figure 6:
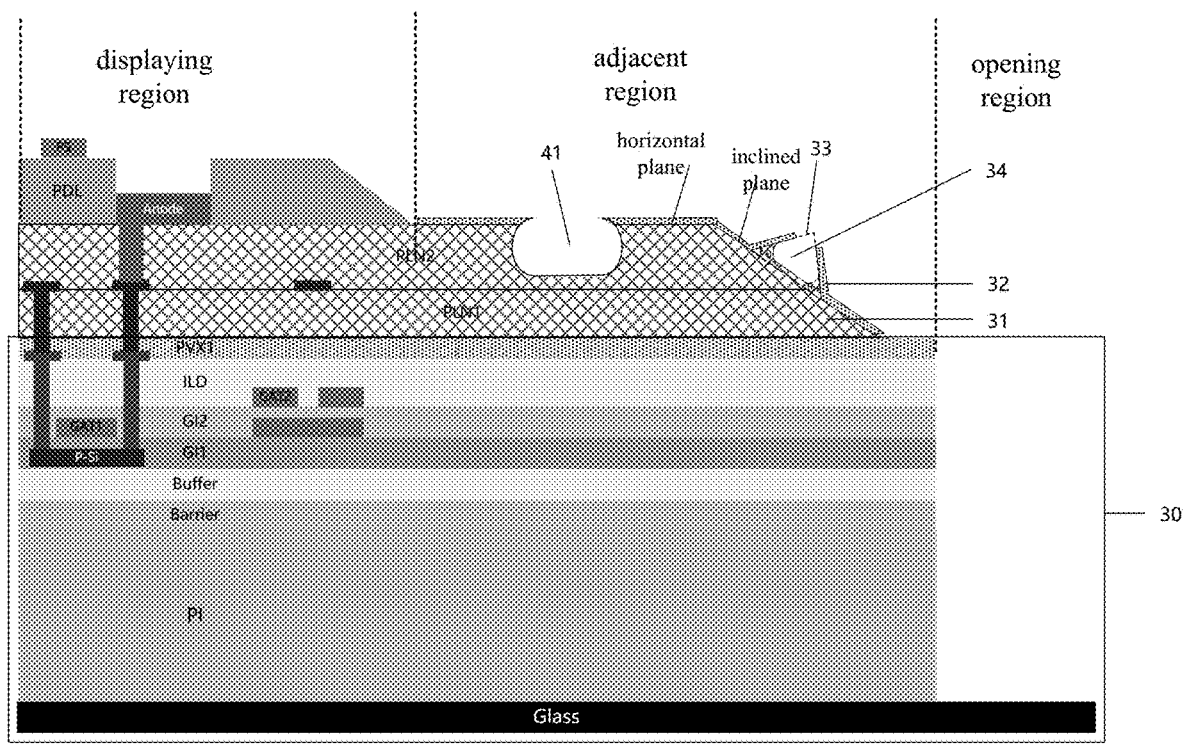
FIG. 6 shows a schematic sectional structural diagram of the second displaying base plate according to an embodiment of the present disclosure.

In order to further prevent water and oxygen from entering the functional film layers from the holes, a plurality of isolating grooves may be provided at the adjacent region. In an optional implementation, referring to FIG. 6, the surface of the one side of the flat layer 31 that is further away from the substrate base plate 30 may further comprise a horizontal plane located on one side of the inclined plane that is closer to the displaying region, and the displaying base plate located within the adjacent region may further comprise: a second isolating groove 41, wherein the second isolating groove 41 extends throughout the passivation layer 32 and extends into the flat layer 31, and the orthographic projection of the second isolating groove 41 on the flat layer 31 is located within the region of the horizontal plane.

In practical applications, the second isolating groove 41 is of a closed structure that surrounds the opening region and has connected head and tail. Within the second isolating groove 41, the flat layer 31 is retracted relative to the passivation layer 32. The quantity of the second isolating grooves 41 within the adjacent region may be one or more, which is particularly determined according to practical demands.

Figure 7:
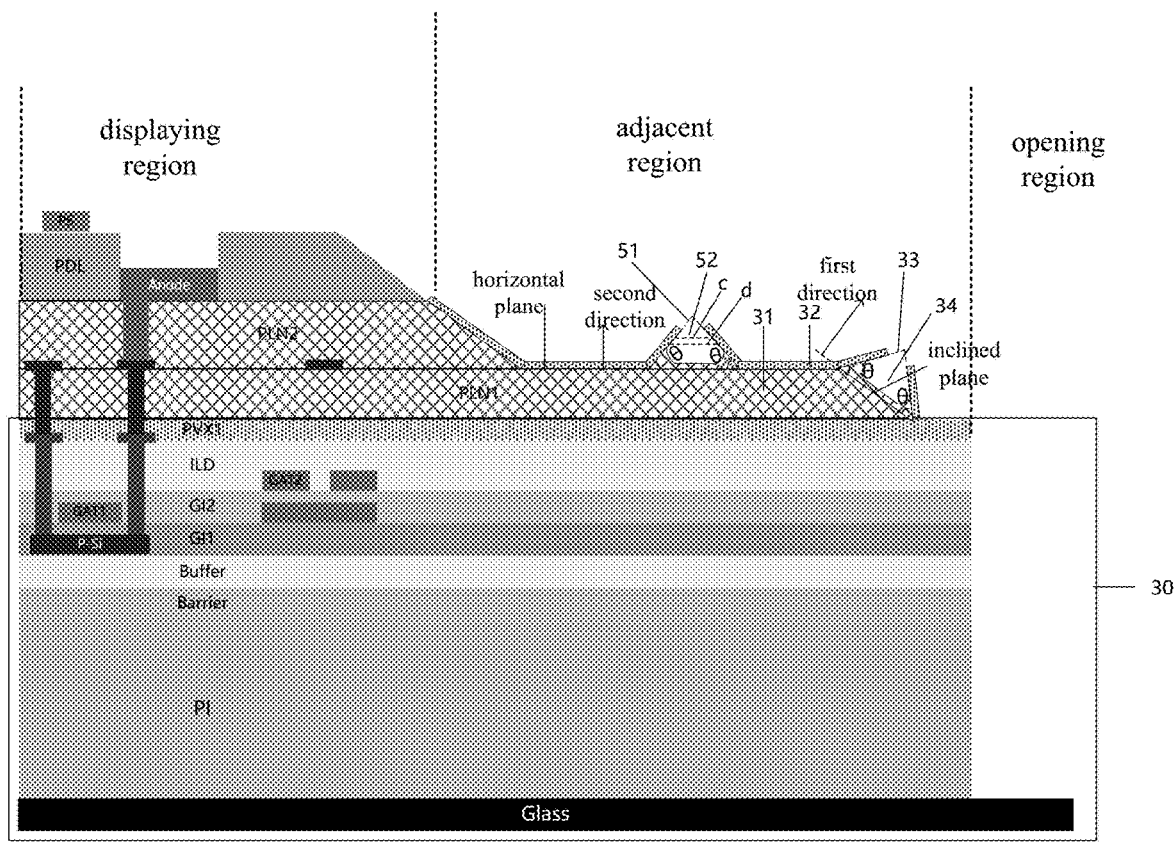
FIG. 7 shows a schematic sectional structural diagram of a third displaying base plate according to an embodiment of the present disclosure.

In another optional implementation, referring to FIG. 7, the surface of the one side of the flat layer 31 that is further away from the substrate base plate 30 may further comprise a horizontal plane located on the one side of the inclined plane that is closer to the displaying region, wherein the flat layer 31 may further comprise a second protrusion 51 provided on the horizontal plane, and in the direction perpendicular to the horizontal plane (the second direction in FIG. 7), the orthographic projection of a third cross-section c of the second protrusion 51 on the horizontal plane is located within the area of the orthographic projection of a fourth cross-section d on the horizontal plane, wherein the third cross-section c is located on one side of the fourth cross-section d that is further away from the horizontal plane; and a third isolating groove 52, wherein the third isolating groove 52 at least partially overlaps with the second protrusion 51, and extends throughout the passivation layer 32 and extends into the second protrusion 51.

The third cross-section c and the fourth cross-section d are cross-sections of the second protrusion 51 in the normal direction of the horizontal plane (the second direction in FIG. 7); in other words, both of the third cross-section c and the fourth cross-section d are parallel to the horizontal plane. Such a structure of the second protrusion 51 can further ensure the intactness of the passivation layer 32 provided on one side of the second protrusion 51 that is further away from the substrate base plate 30, and prevent the defect of the passivation layer 32 caused by the loss of the photoresist.

It should be noted that, for reasons such as process deviations, the angle between the second direction and the horizontal plane might not be strictly 90°. Therefore, the angle between the second direction and the horizontal plane is not limited to 90°, and the actual angle therebetween is decided by the capacity of process controlling.

In practical applications, the third isolating groove 52 is of a closed structure that surrounds the opening region and has connected head and tail. The second protrusion 51 may surround the opening region, and in the direction of the surrounding of the opening region by the second protrusion 51, the cross-section of the second protrusion 51 may, for example, be a triangle, a trapezoid whose longer side is closer to the inclined plane, an arc whose opening faces the inclined plane, and so on.

In the direction of the surrounding of the opening region by the second protrusion 51, the size of the orthographic projection of the cross-section of the second protrusion 51 on the horizontal plane may be greater than or equal to 3 μm and less than or equal to 8 μm. When the cross-section of the second protrusion 51 is a triangle, the bottom side of the triangle may be greater than or equal to 3 μm and less than or equal to 8 μm. Accordingly, the intactness of the passivation layer 32 provided on the one side of the second protrusion 51 that is further away from the substrate base plate 30 can be further ensured, to prevent the defect of the passivation layer 32 caused by the loss of the photoresist.

Referring to FIG. 7, within the third isolating groove 52, the flat layer 31 is retracted relative to the passivation layer 32. In practical applications, the third isolating groove 52 is formed by sequentially dry-etching the passivation layer 32 and the flat layer 31, wherein the transverse etching amount of the flat layer 31 is greater than the transverse etching amount of the passivation layer 32, which makes the groove mouth of the third isolating groove 52 relatively narrow. That can result in the appearance of "undercut+upward opening" of the third isolating groove 52, which further improves the adhesion effect of the packaging film layer in the third isolating groove 52, and ensures the packaging performance.

The included angle θ between the side face of the second protrusion 51 and the horizontal plane may be greater than or equal to 30° and less than or equal to 55°. Accordingly, the intactness of the passivation layer 32 provided on the one side of the first protrusion 33 that is further away from the substrate base plate 30 can be further ensured, to prevent the defect of the passivation layer 32 caused by the loss of the photoresist.

Another embodiment of the present disclosure further provides a displaying device, wherein the displaying device comprises the displaying base plate according to any one of the above embodiments.

It should be noted that the displaying device according to the present embodiment may be any products or components that have the function of 2D or 3D displaying, such as a display panel, an electronic paper, a mobile phone, a tablet personal computer, a TV set, a notebook computer, a digital photo frame and a navigator.

Figure 8:
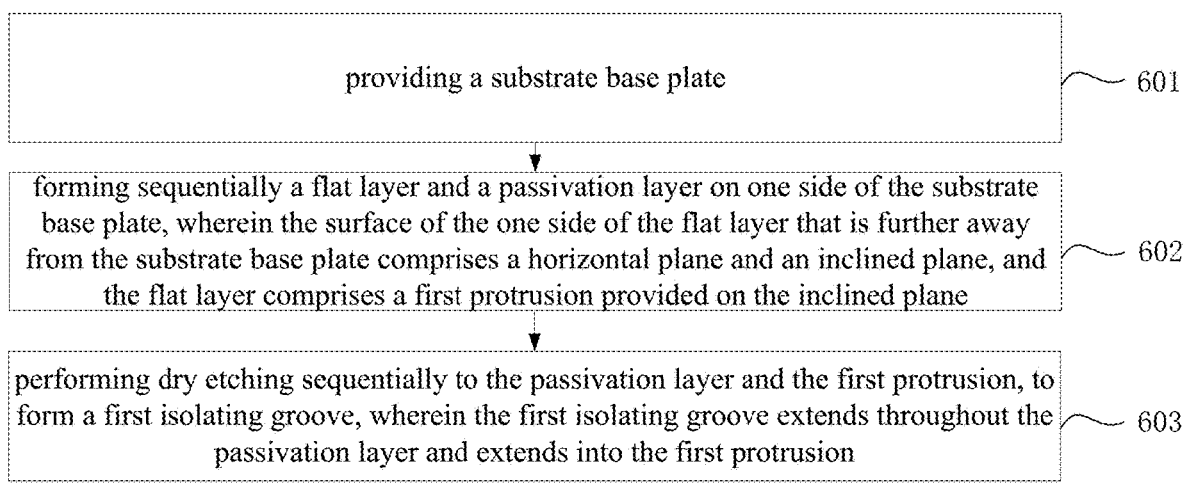
FIG. 8 shows a flow chart of the steps of the fabricating method of a displaying base plate according to an embodiment of the present disclosure.

Another embodiment of the present disclosure further provides a fabricating method of a displaying base plate, wherein the displaying base plate comprises an opening region, an adjacent region surrounding the opening region, and a displaying region surrounding the adjacent region, referring to FIG. 8, and the fabricating method of a displaying base plate located within the adjacent region comprises:

Step 601: providing a substrate base plate.

Step 602: forming sequentially a flat layer and a passivation layer on one side of the substrate base plate, wherein a surface of one side of the flat layer that is further away from the substrate base plate comprises at least an inclined plane adjacent to one side of the opening region, and the flat layer comprises a first protrusion provided on the inclined plane.

Figure 9:
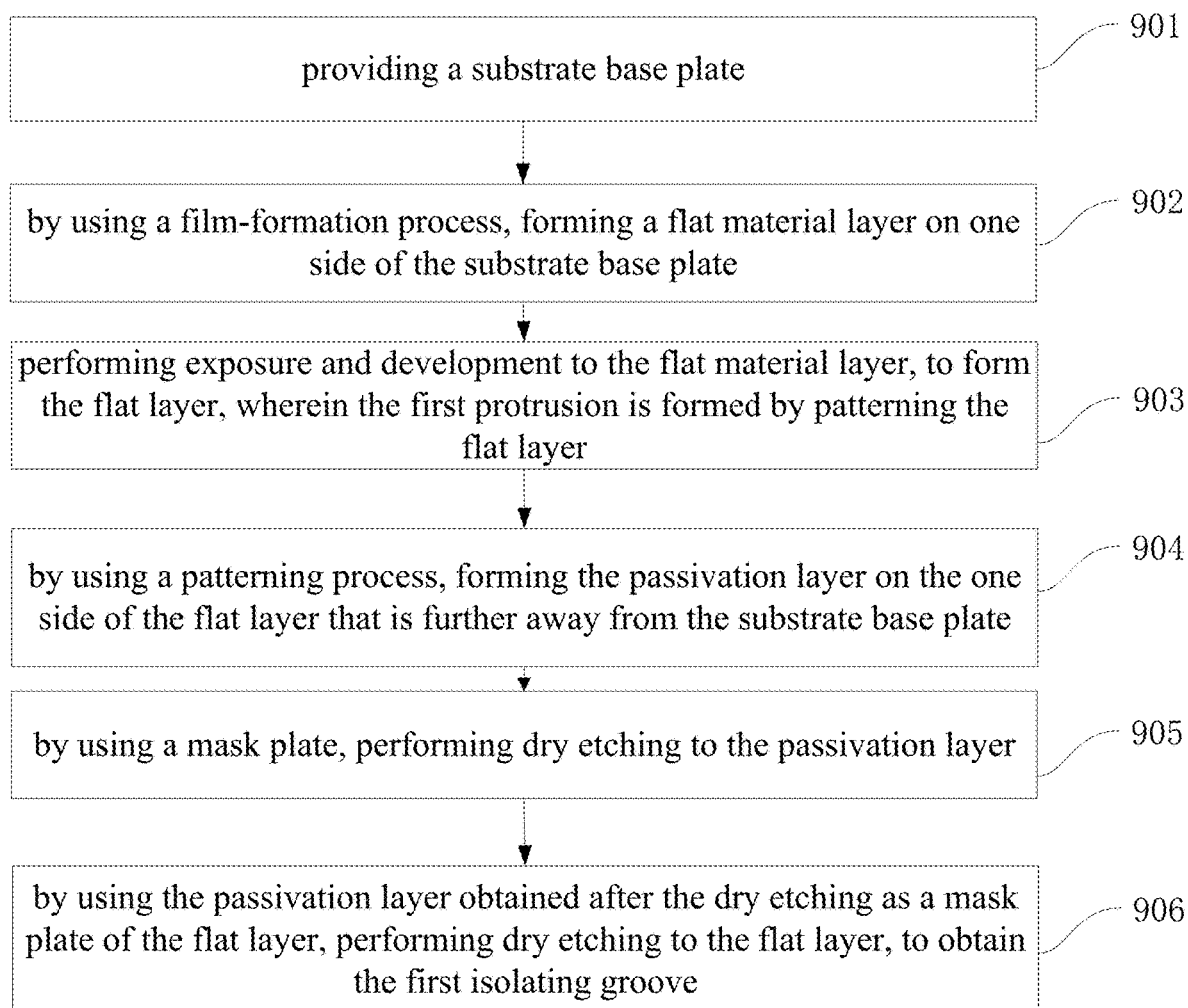
FIG. 9 shows a flow chart of the steps of the fabricating method of a displaying base plate according to another embodiment of the present disclosure.

Referring to FIG. 9, in an optional implementation, the step of forming sequentially the flat layer and the passivation layer on the one side of the substrate base plate comprises:

Sub-step 901: providing a substrate base plate.

Sub-step 902: by using a film-formation process, forming a flat material layer on one side of the substrate base plate.

Sub-step 903: performing exposure and development to the flat material layer, to form the flat layer.

Figure 10:
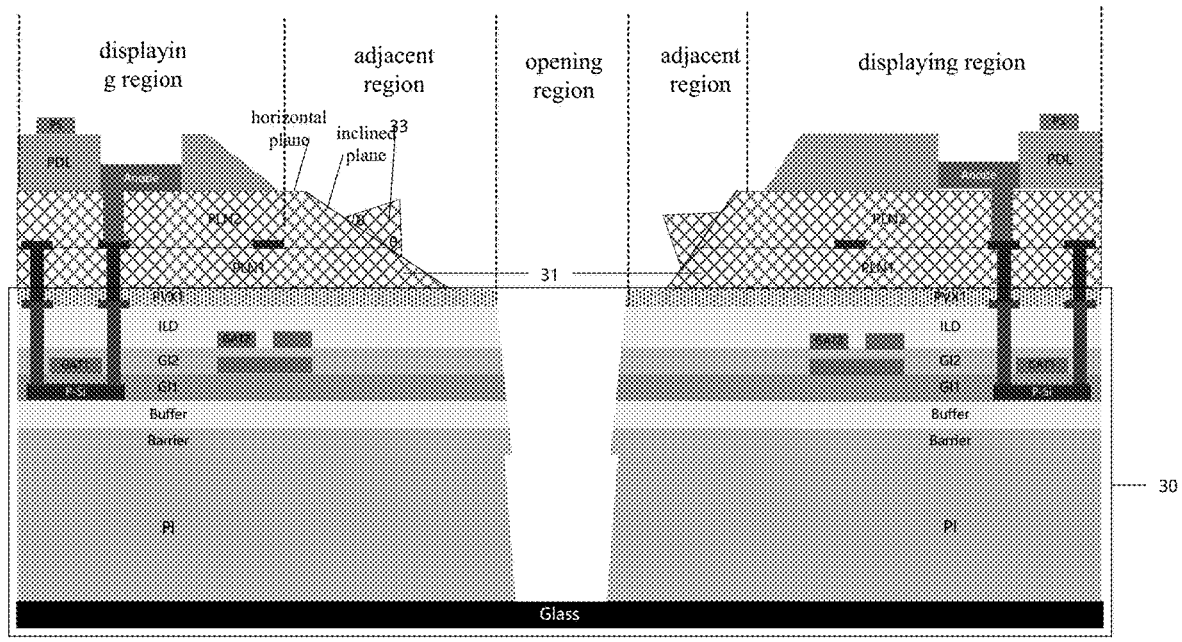
FIG. 10 shows a schematic sectional structural diagram of the displaying base plate in which the fabrication of the flat layer has been completed according to an embodiment of the present disclosure.

Particularly, the flat material layer is patterned in the region of the first isolating groove, to form the first protrusion. In the direction of the surrounding of the opening region by the first protrusion, the cross-section of the first protrusion may, for example, be a triangle, a trapezoid whose longer side is closer to the inclined plane, an arc whose opening faces the inclined plane, and so on. By using the exposure process, the Taper angle of the side face of the first protrusion relative to the inclined plane may be controlled at 30°-55°. Referring to FIG. 10, FIG. 10 shows a schematic sectional structural diagram of the displaying base plate in which the fabrication of the flat layer has been completed.

By patterning the flat layer to form the first protrusion, the photoresist can be blocked from flowing toward the opening region during the patterning of the passivation layer, which prevents the defect of the passivation layer caused by the loss of the photoresist, thereby forming an isolating groove of a complete structure.

Figure 11:
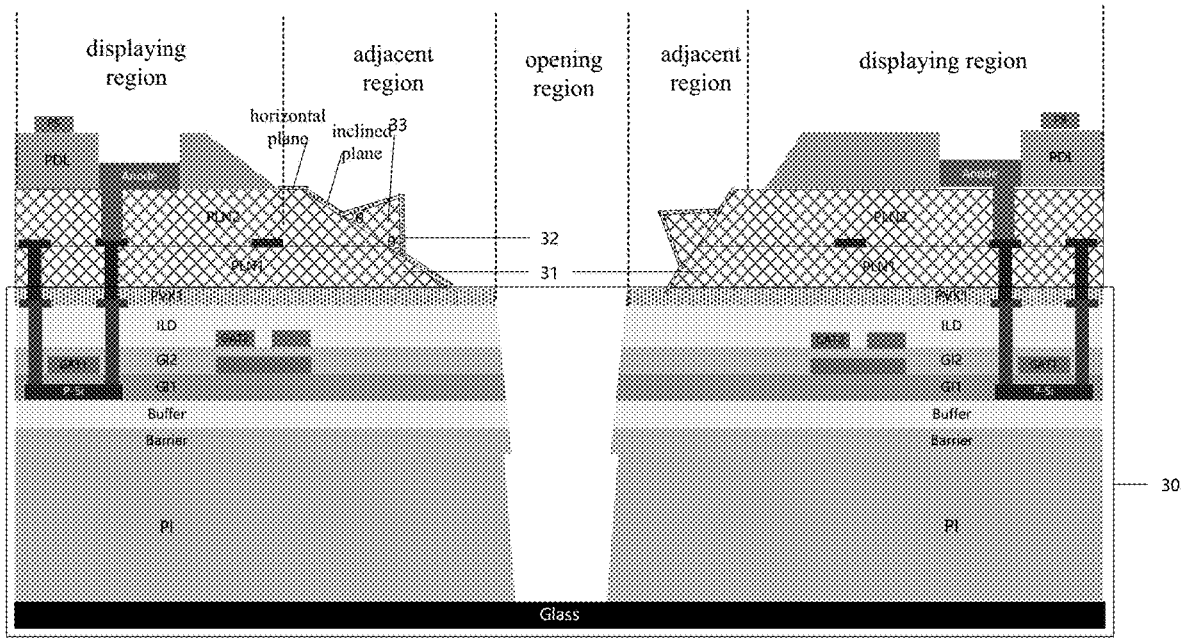
FIG. 11 shows a schematic sectional structural diagram of the displaying base plate in which the fabrication of the passivation layer has been completed according to an embodiment of the present disclosure.

Sub-step 904: by using a patterning process, forming the passivation layer on the one side of the flat layer that is further away from the substrate base plate. Referring to FIG. 11, FIG. 11 shows a schematic sectional structural diagram of the displaying base plate in which the fabrication of the passivation layer has been completed.

Step 603: performing dry etching sequentially to the passivation layer and the first protrusion, to form a first isolating groove, wherein the first isolating groove and the first protrusion at least partially overlap, and the first isolating groove extends throughout the passivation layer and extends into the first protrusion.

The transverse etching amount of the first protrusion is greater than the transverse etching amount of the passivation layer, whereby, within the first isolating groove, the flat layer is retracted relative to the passivation layer.

In an optional implementation, referring to FIG. 9, the step 603 may particularly comprise: sub-step 905: by using a mask plate, performing dry etching to the passivation layer; and sub-step 906: by using the passivation layer obtained after the dry etching as a mask plate of the flat layer, performing dry etching to the flat layer, to obtain the first isolating groove. Referring to FIG. 4, FIG. 4 shows a schematic sectional structural diagram of the displaying base plate in which the fabrication of the first isolating groove has been completed.

The present embodiment can result in the appearance of "undercut+upward opening" of the first isolating groove, which further improves the adhesion effect of the packaging film layer in the first isolating groove, and ensures the packaging performance. By using the fabricating method according to the present embodiment, as compared with the related art, for the same side-etching depth, by forming the first isolating groove, the etched volume of the flat layer can be reduced by 20%-40%. Therefore, the present embodiment can shorten the etching duration, improve the production efficiency, and reduce the production cost.

By using the fabricating method according to the present embodiment, the displaying base plate according to any one of the above embodiments can be obtained. The particular structure of the displaying base plate may refer to the description on the above embodiments, and are not discussed herein further.

The embodiments of the present disclosure provide a displaying base plate and a fabricating method thereof, and a displaying device, wherein the displaying base plate comprises an opening region, an adjacent region surrounding the opening region, and a displaying region surrounding the adjacent region, and the displaying base plate located within the adjacent region comprises: a substrate base plate; a flat layer and a passivation layer that are provided on one side of the substrate base plate, wherein the passivation layer is provided on one side of the flat layer that is further away from the substrate base plate, a surface of the one side of the flat layer that is further away from the substrate base plate comprises at least an inclined plane adjacent to one side of the opening region, and the flat layer comprises a first protrusion provided on the inclined plane; and a first isolating groove that at least partially overlaps with the first protrusion and extends throughout the passivation layer and extends into the first protrusion. The technical solutions of the present disclosure, by providing on the inclined plane of the flat layer the first protrusion, which can block the photoresist from flowing toward the opening region, prevent the defect of the passivation layer caused by the loss of the photoresist, thereby forming an isolating groove of a complete structure. The isolating groove of a complete structure facilitates the adhesion of the packaging structure, thereby improving the reliability and the displaying performance of the displaying device.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The displaying base plate and the fabricating method thereof, and the displaying device according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

The invention claimed is:

1. A displaying base plate, wherein the displaying base plate comprises an opening region, an adjacent region surrounding the opening region, and a displaying region surrounding the adjacent region, and the displaying base plate located within the adjacent region comprises:
   a substrate base plate;
   a flat layer and a passivation layer, wherein the flat layer is provided on one side of the substrate base plate, the passivation layer is provided on one side of the flat layer that is further away from the substrate base plate, a surface of the one side of the flat layer that is further away from the substrate base plate comprises at least an inclined plane adjacent to one side of the opening region, and the flat layer comprises a first protrusion provided on the inclined plane; and
   a first isolating groove, wherein the first isolating groove and the first protrusion at least partially overlap, and the first isolating groove extends throughout the passivation layer and extends into the first protrusion.

2. The displaying base plate according to claim 1, wherein in a direction perpendicular to the inclined plane, an orthographic projection of a first cross-section of the first protrusion on the inclined plane is located within an area of an orthographic projection of a second cross-section on the inclined plane, wherein the first cross-section is located on one side of the second cross-section that is further away from the inclined plane.

3. The displaying base plate according to claim 1, wherein an included angle between a side face of the first protrusion and the inclined plane is greater than or equal to 30°, and less than or equal to 55°.

4. The displaying base plate according to claim 1, wherein the first protrusion surrounds the opening region, and in a direction of surrounding of the opening region by the first protrusion, a size of an orthographic projection of a cross-section of the first protrusion on the inclined plane is greater than or equal to 3 μm, and less than or equal to 8 μm.

5. The displaying base plate according to claim 4, wherein in the direction of surrounding of the opening region by the first protrusion, a ratio of the size of the orthographic projection of the cross-section of the first protrusion on the inclined plane to a size of the inclined plane is greater than or equal to 30%, and less than or equal to 80%.

6. The displaying base plate according to claim 1, wherein within the first isolating groove, the flat layer is retracted relative to the passivation layer.

7. The displaying base plate according to claim 1, wherein a surface of the one side of the flat layer that is further away from the substrate base plate further comprises a horizontal plane located on one side of the inclined plane that is closer to the displaying region, and the displaying base plate located within the adjacent region further comprises: a second isolating groove; and the second isolating groove extends throughout the passivation layer and extends into the flat layer, and an orthographic projection of the second isolating groove on the flat layer is located within an area of the horizontal plane.

8. The displaying base plate according to claim 7, wherein within the second isolating groove, the flat layer is retracted relative to the passivation layer.

9. The displaying base plate according to claim 1, wherein a surface of the one side of the flat layer that is further away from the substrate base plate further comprises a horizontal plane located on one side of the inclined plane that is closer to the displaying region, and the flat layer further comprises a second protrusion provided on the horizontal plane; and in a direction perpendicular to the horizontal plane, an orthographic projection of a third cross-section of the second protrusion on the horizontal plane is located within an area of an orthographic projection of a fourth cross-section on the horizontal plane, wherein the third cross-section is located on one side of the fourth cross-section that is further away from the horizontal plane.

10. The displaying base plate according to claim 9, wherein the displaying base plate further comprises:

a third isolating groove, wherein the third isolating groove and the second protrusion at least partially overlap, and the third isolating groove extends throughout the passivation layer and extends into the second protrusion.

11. The displaying base plate according to claim 9, wherein an included angle between a side face of the second protrusion and the horizontal plane is greater than or equal to 30°, and less than or equal to 55°.

12. The displaying base plate according to claim 10, wherein within the third isolating groove, the flat layer is retracted relative to the passivation layer.

13. A displaying device, wherein the displaying device comprises the displaying base plate according to claim 1.

14. A fabricating method of a displaying base plate, wherein the displaying base plate comprises an opening region, an adjacent region surrounding the opening region, and a displaying region surrounding the adjacent region, and the fabricating method of a displaying base plate located within the adjacent region comprises:

providing a substrate base plate;

forming sequentially a flat layer and a passivation layer on one side of the substrate base plate, wherein a surface of one side of the flat layer that is further away from the substrate base plate comprises at least an inclined plane adjacent to one side of the opening region, and the flat layer comprises a first protrusion provided on the inclined plane; and performing dry etching sequentially to the passivation layer and the first protrusion, to form a first isolating groove, wherein the first isolating groove and the first protrusion at least partially overlap, and the first isolating groove extends throughout the passivation layer and extends into the first protrusion.

15. The fabricating method according to claim 14, wherein the step of forming sequentially the flat layer and the passivation layer on the one side of the substrate base plate comprises:

by using a film-formation process, forming a flat material layer on one side of the substrate base plate;

performing exposure and development to the flat material layer, to form the flat layer, wherein the first protrusion is formed by patterning the flat layer; and by using a patterning process, forming the passivation layer on the one side of the flat layer that is further away from the substrate base plate.

16. The fabricating method according to claim 14, wherein the step of performing dry etching sequentially to the passivation layer and the first protrusion, to form the first isolating groove comprises:

by using a mask plate, performing dry etching to the passivation layer; and by using the passivation layer obtained after the dry etching as a mask plate of the flat layer, performing dry etching to the first protrusion, to obtain the first isolating groove.

17. The fabricating method according to claim 16, wherein a transverse etching amount of the first protrusion is greater than a transverse etching amount of the passivation layer.

* * * * *